United States Patent [19]
McCullough

[11] Patent Number: 5,896,188
[45] Date of Patent: Apr. 20, 1999

[54] REDUCTION OF PATTERN NOISE IN SCANNING LITHOGRAPHIC SYSTEM ILLUMINATORS

[75] Inventor: Andrew W. McCullough, Newtown, Conn.

[73] Assignee: SVG Lithography Systems, Inc., Wilton, Conn.

[21] Appl. No.: 08/835,653

[22] Filed: Apr. 10, 1997

Related U.S. Application Data

[60] Provisional application No. 60/031,746, Nov. 25, 1996.

[51] Int. Cl.$^6$ ............................................. G03B 27/52
[52] U.S. Cl. ............................. 355/67; 355/53; 355/71
[58] Field of Search ................................. 355/53, 45, 67, 355/68, 71, 77; 362/268; 359/562; 250/548

[56] References Cited

U.S. PATENT DOCUMENTS

| | | | |
|---|---|---|---|
| 4,939,630 | 7/1990 | Kikuchi et al. | 362/268 |
| 5,237,367 | 8/1993 | Kudo | 355/67 |
| 5,245,384 | 9/1993 | Mori | 355/67 |
| 5,272,501 | 12/1993 | Nishi et al. | 355/53 |
| 5,296,892 | 3/1994 | Mori | 355/67 |
| 5,300,971 | 4/1994 | Kudo | 355/67 |
| 5,329,336 | 7/1994 | Hirano et al. | 355/53 |
| 5,357,312 | 10/1994 | Tounai | 355/67 |
| 5,359,388 | 10/1994 | Hollman | 355/53 |
| 5,367,358 | 11/1994 | Kamon | 355/71 |
| 5,446,587 | 8/1995 | Kang et al. | 359/562 |
| 5,534,970 | 7/1996 | Nakashima et al. | 355/53 |
| 5,631,721 | 5/1997 | Stanton et al. | 355/71 |
| 5,684,566 | 11/1997 | Stanton | 355/67 |
| 5,719,704 | 2/1998 | Shiraishi et al. | 355/67 |

FOREIGN PATENT DOCUMENTS

0 486 316 A2  5/1992  European Pat. Off. .

*Primary Examiner*—D. Rutledge
*Attorney, Agent, or Firm*—Fattibene & Fattibene; Paul A. Fattibene; Arthur T. Fattibene

[57] ABSTRACT

An illumination system for a scanning lithography system used in the manufacture of semiconductor devices having a multiplex array or multi-image array resulting in pattern noise that is reduced by a spatially frequency modulated multiplex array or frequency modulating the pulse rate of a pulsed laser source. A pulsed laser source is used to illuminate a reticle containing a pattern thereon to be reproduced onto a semiconductor. An illumination system using a multiplex array or multi-image array to obtain macro uniformity of an illumination slot or field introduces micro non-uniformity that results in undesirable pattern noise or fixed pattern noise resulting in undesirable imaging properties. The undesirable effects of the pattern noise are eliminated or substantially reduced by spatially modulating the multiplex array in a scanning direction so that the periodic pattern has a linear magnification dependent on position. In another embodiment the pulse rate of the pulsed laser source is frequency modulated. The present invention improves linewidth control, linewidth variation, and edge roughness.

18 Claims, 5 Drawing Sheets

REDUCTION OF PATTERN NOISE IN SCANNING LITHOGRAPHIC SYSTEM ILLUMINATORS

RELATED APPLICATION

This application claims the benefit of U.S. Provisional Application No. 60/031,746, filed Nov. 25, 1996.

FIELD OF THE INVENTION

The present invention relates generally to an illumination system used in photolithography for the manufacture of semiconductor devices, and more particularly to an illumination system using multiplex arrays or multi-image optical elements.

BACKGROUND OF THE INVENTION

In the manufacture of semiconductor devices photolithographic techniques are used to reproduce the image of a reticle onto a photosensitive resist covered semiconductor wafer. The reticle contains patterns that are imaged onto the photosensitive resist covered wafer. After a series of exposures and subsequent processing, a semiconductor device containing a circuit pattern thereon is manufactured. An illumination system is used to provide a flux of electromagnetic radiation for the projection of the image of the reticle onto a semiconductor wafer. The image of the reticle is formed by an optical projection system that collects the electromagnetic radiation after passing through the reticle and projects the image of the reticle onto the photosensitive resist covered semiconductor wafer. As semiconductor device manufacturing technology advances, there are ever increasing demands on each component of the photolithography system used to manufacture the semiconductor devices. This includes the illumination system used to illuminate the reticle. There are many prior illumination systems that enhance uniformity of illumination and minimize loss of light. One such illumination system is disclosed in U.S. Pat. No. 5,300,971 entitled "Projection Exposure Apparatus" issuing to Kudo on Apr. 5, 1994, which is herein incorporated by reference. Therein disclosed is an illumination system having a pulsed light source with a rotating deflecting prism used to direct the pulsed light to a fly's eye lens separated from the optical axis. A condenser is then used to condense the light from the fly's eye lens for illuminating a reticle. Another illumination system is disclosed in U.S. Pat. No. 5,296,892 entitled "Illuminating Apparatus and Projection Exposure Apparatus Provided With Such Illumination Apparatus" issuing to Mori on Mar. 22, 1994, which is herein incorporated by reference. Therein disclosed is an illumination system having an optical integrator or a fly's eye lens positioned before a condenser. The optical integrator or a fly's eye lens is designed to be replaceable so that the numerical aperture on the emission side of the illumination system can be varied. Another illumination system is disclosed in U.S. Pat. No. 5,245,384 entitled "Illuminating Optical Apparatus and Exposure Apparatus Having The Same" issuing to Mori on Sep. 14, 1993, which is herein incorporated by reference. Therein disclosed is an illumination system having an afocal zoom optical system placed before an optical integrator or fly's eye lens to vary the size of a plurality of secondary light sources. Yet another illumination system is disclosed in U.S. Pat. No. 5,237,367 entitled "Illuminating Optical System and Exposure Apparatus Utilizing The Same" issuing to Kudo on Aug. 17, 1993, which is herein incorporated by reference. Therein disclosed is an illumination system having a first optical integrator or fly's eye lens and a first condenser followed by a second optical integrator or fly's eye lens and a second condenser. The second condenser then provides illumination to a reticle. Either the first optical integrator or fly's eye lens and the first condenser have a variable focal length. A further illumination system is disclosed in U.S. Pat. No. 4,939,630 entitled "Illumination Optical Apparatus" issuing to Kikuchi et al on Jul. 3, 1990, which is herein incorporated by reference. Therein disclosed is an illumination system having a first optical integrator or means for forming a plurality of light source images followed by an optical system containing a second optical integrator or tertiary light source forming means followed by a condenser which directs illumination onto a reticle. A further illumination system is disclosed in U.S. Pat. No. 5,534,970 issuing to Nakashima et al on Jul. 9, 1996, which is herein incorporated by reference. Therein disclosed is an illumination system that uses a scanning pivot mirror to scan interference fringes to obtain desired illumination in a scanning exposure apparatus. Additionally, moving diffusers and other well established techniques have been used in the past in an effort to obtain more desirable illumination properties.

While many of these prior illumination systems have provided improved illumination for their particular application, there is still a need to provide an illumination system that can be easily manufactured and provides uniform illumination and eliminates or reduces pattern noise effects that may occur in these prior illumination systems when illumination sources that have coherence properties, such as a laser, are used in a scanning lithography system.

SUMMARY OF THE INVENTION

The present invention may be used in an illumination system that uses a multiplex array or multi-image optical element as part of the illumination system in a scanning lithography system used to project a portion of a reticle onto a photosensitive resist covered wafer. An illumination system according to the present invention may comprise an illumination source, such as a pulsed laser, and optical components such as a beam conditioner, (at least one) multiplex array or multi-image optical element, a condenser, and a relay. A spatial frequency modulator is coupled to the (at least one) multiplex array or multi-image optical element. The spatial frequency modulator effectively moves the multiplex array or multi-image optical element in a spatial direction of the direction of scan of the scanning lithography system. The multiplex array may also have a pattern that is spatially frequency modulated in the scanning dimension. The modulation is sufficient so that a periodic pattern has a linear magnification modulation dependent on position. In another embodiment of the invention the pulse rate of a laser is frequency modulated. The frequency modulation range and rate are chosen so that several cycles are completed during a single scan.

Accordingly, it is an object of the present invention to reduce pattern noise effects resulting from the use of multiplex arrays or multi-image optical elements used in illumination systems, and in particular illumination systems using pulsed laser sources.

It is an advantage of the present invention that it may be used to improve most illumination systems using a multiplex array or multi-image optical element.

It is a feature of the present invention that a modulator is coupled to a multiplex array or multi-image optical element.

It is another feature of the present invention that the multiplex array has a pattern that is spatially frequency modulated in the scan direction.

It is another feature of the present invention that the pulse rate of a laser source is frequency modulated.

These and other objects, advantages, and features will become apparent in view of the following more detailed description.

DETAILED DESCRIPTION OF THE PREFERRED EMBODIMENTS

Figure 1:
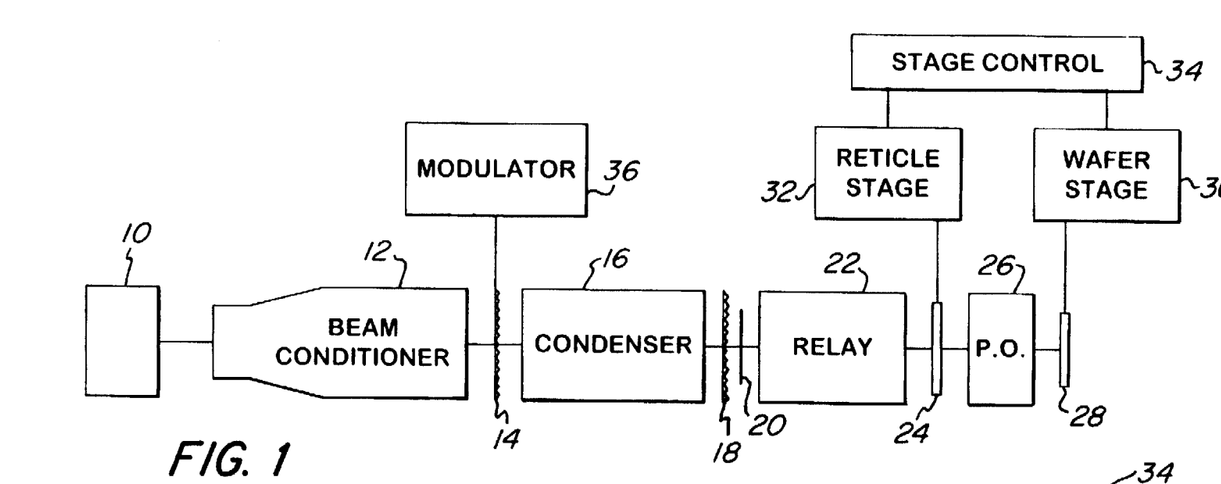
FIG. 1 schematically illustrates one embodiment of the present invention.

FIG. 1 illustrates one embodiment of the present invention. An illumination source 10 directs electromagnetic radiation into a beam conditioner 12. The term illumination source is used in its broadest sense to mean any electromagnetic radiation source regardless of wavelength. Therefore, the illumination source 10 may be a laser having a wavelength that is not in the visible region. Additionally, the illumination source may be a pulsed laser or a continuous wave laser. The beam conditioner 12 enlarges or modifies the beam of electromagnetic radiation from the illumination source 10. This may be accomplished by a beam expander such as a refractive optical system, or a reflective optical system. The conditioned electromagnetic radiation is directed through a multiplex array or multi-image optical element 14. The multiplex array or multi-image optical element 14 may be a microlens array comprised of a plurality of refractive lens elements or a diffractive optical element. Multi-image optical element 14 directs light to a condenser 16. For a scanning photolithography system, the condenser 16 is preferably an anamorphic condenser in that a rectangular slit illumination field is formed thereby. The condenser 16 collects light from the multi-image optical element 14 and directs it to an array optical element 18. The array optical element 18 may not be used in some illumination systems. However, the use of the array optical element 18 may be desirable in some applications as indicated in U.S. patent application Ser. No. 08/449,301 filed May 24, 1995 and issuing as U.S. Pat. No. 5,631,721 to Stanton et al on May 20, 1997 and entitled "Hybrid Illumination System for Use in Photolithogrphy", which is herein incorporated by reference. An illumination plane 20 is formed after the condenser 16 and optional array optical element 18. Relay 22 is used simply to conjugate the illumination plane 20 to a reticle 24. The image of the reticle 24 is projected by projection optics 26 onto the wafer 28. Reticle 24 is placed on and moved by a reticle stage 32. The wafer is placed on and moved by a wafer stage 30. Stage control 34 controls the movement of reticle stage 24 and wafer stage 30. The movement of the reticle stage 24 and the wafer stage 30 are generally synchronized in proportion to the magnification of the system. A modulator 36 is coupled to multiplex array or multi-image optical element 14. The modulator 36 spatially frequency modulates the multiplex array or multi-image optical element in the scanning dimension so that a periodic pattern has a linear magnification dependent on position. When this pattern is multiplicatively printed in the scanning process the patterns can be made so aliasing will not occur. It should be appreciated that the present invention is not limited to the illustrated illumination system described, but is applicable to any illumination system utilizing a multiplexing array or multi-image optical element whether for controlling macro uniformity, the numerical aperture of the illumination system, or partial coherence of the lithographic system. This system decoheres any residual pattern (or regular variance in illumination) by having multiple spatially displaced illumination "patches", by small amounts, such that over the plurality of time for exposure many displaced fields are overlaid and regular pattern noise will be averaged.

Figure 2:
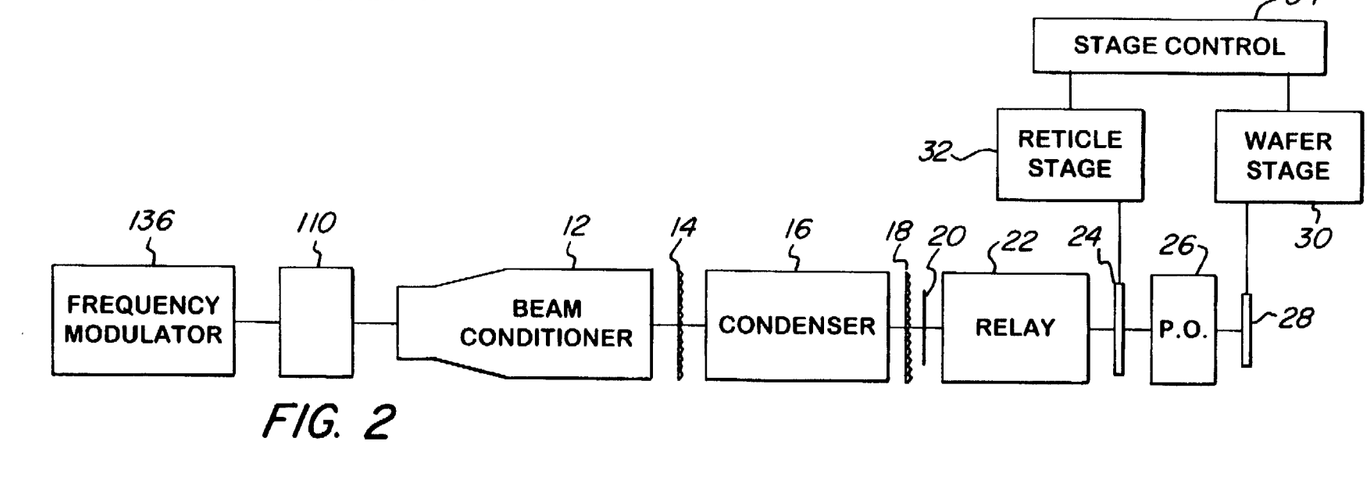
FIG. 2 schematically illustrates another embodiment of the present invention.

FIG. 2 illustrates another embodiment of the present invention. In FIG. 2 a pulsed laser source 110 provides electromagnetic radiation to beam conditioner 12, and then to a multiplex array or multi-image optical element 14, then to a condenser 16, and a array optical element 18, forming an illumination plane 20. The illumination plane 20 is conjugated by relay 22, to illuminate a reticle 24. The image of the reticle 24 is projected by projection optics 26 onto a photosensitive resist covered wafer 28. The position of the reticle 24 and the wafer 30 is controlled by reticle stage 32, wafer stage 20 and stage control 34. The embodiment illustrated in FIG. 2 is similar to the embodiment illustrated in FIG. 1, however a frequency modulator 136 is coupled to pulsed laser source 110. The frequency modulator 136 modulates the pulse rate of the pulse laser 110. The frequency modulation range and the frequency modulation rate are chosen so that several cycles of the frequency modulation range can be completed or done during the scan time or in a single scan. This will ensure that no aliasing will occur. Each pulse will have associated with it a periodic spatial modulation. If the pulse rate changes over an exposure time then these patterns will not overlap in space and averaging will occur. That is, as the pulse rate changes the patterns will move with respect to the exposed wafer as it scans and have a different position preventing any overlap and therefore any cumulative effect that can degrade imaging.

Figure 3:
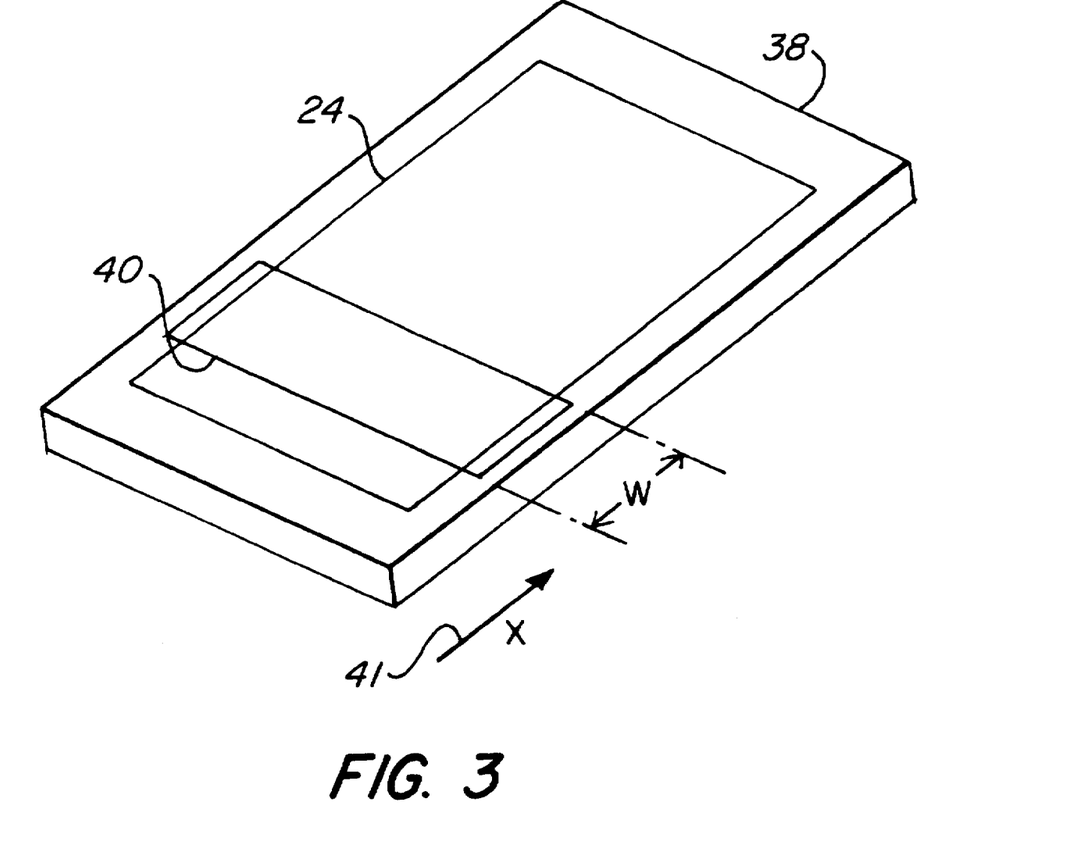
FIG. 3 is a perspective view of a reticle illustrating the illumination slot or field.

FIG. 3 more clearly illustrates the scanning illumination slot or field formed with the present invention. A reticle frame 38 holds a reticle 24. A rectangular illumination slot or field 40 is formed that has a width w. The illumination slot or field 40 is scanned in a longitudinal direction across the reticle 24 in the x direction indicated by the arrow 41. Typically, the reticle frame 38 is attached to a reticle stage, not illustrated, moving the reticle 24 relative to the illumination slot or field 40.

Figure 4:
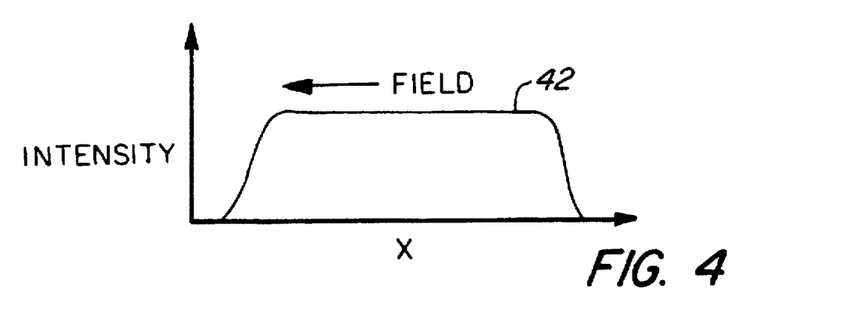
FIG. 4 is a graph illustrating the intensity profile along the width of the illumination slot or filed.

FIG. 4 graphically illustrates the illumination intensity profile across the width of the illumination slot or field. Wave form 42 represents the illumination intensity in the width or x direction. While the illumination intensity appears relatively uniform, as desired, often there is micro non-uniformity.

Figure 5:
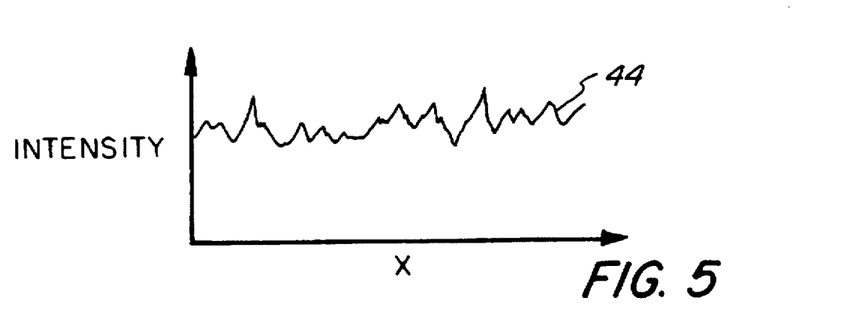
FIG. 5 is a graph illustrating an enlarged view of a portion of the intensity profile illustrated in FIG. 4.

FIG. 5 is an enlarged section of a portion of the wave form 42 illustrated in FIG. 4 showing the micro non-uniformity of the illumination intensity. Wave form 44 illustrates characteristic spatial non-uniformity from a lower limit set by the spatial frequency pass band of the projection optics used. Higher spatial frequencies may be present, but are generally not of interest. Typically, 0.2 µm for a high numerical aperture, 0.60, system with magnification scaling as needed. This micro non-uniformity is not desirable as it will often result in imaging problems, such as lack of linewidth control, linewidth variation, edge roughness, and other phenomena known to those skilled in the art.

Figure 6:
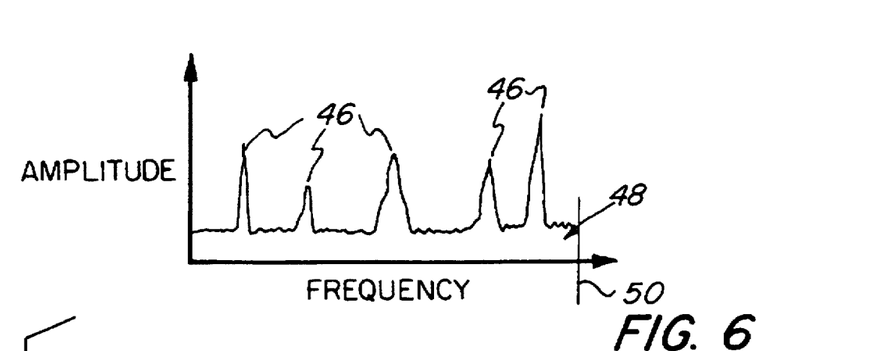
FIG. 6 is a power spectrum graph illustrating regular patterns and random noise.

FIG. 6 graphically illustrates the intensity as a function of frequency of the micro non-uniformity illustrated in FIG. 5. Peak wave form portions 46 represent a fixed or periodic component and wave form portions 48 represent a random pattern. This is in reference to a pulsed laser source, but applies to a continuous source with some limitations. Point 50 is the system band pass upper limit. In a scanning lithography system the random component illustrated by wave form portion 48 will be averaged out with a reduction in the noise or illumination micro non-uniformity variation of the square root of the number of pulses employed per unit exposure position. The periodic complex component may or may not be reduced in magnitude depending on the aliasing between the scan velocity, pulse rate, and pattern frequency.

Figure 7:
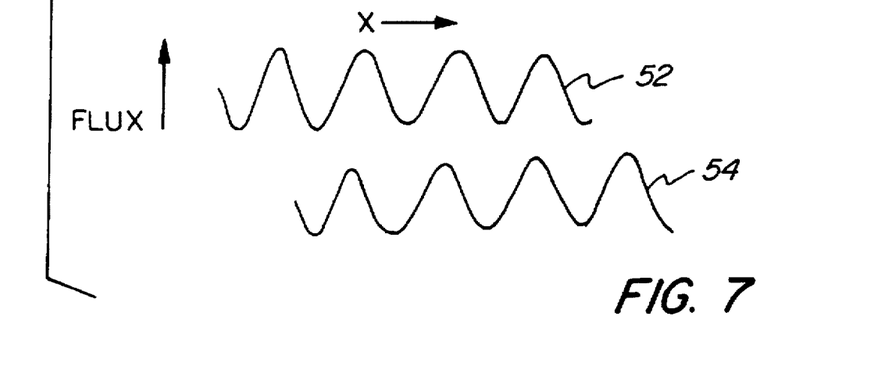
FIG. 7 is a graph illustrating a first laser pulse pattern and a second laser pulse pattern.

FIG. 7 graphically illustrates a first pulse pattern represented by wave form 52 and a second pulse pattern represented by wave form 54. In FIG. 7 a phase aliasing condition is illustrated which is detrimental. The occurrence of these aliasing portions will be complex, therefore a look up table to prevent operation of the scanning stage at predetermined velocity components is inconvenient and not reliable. The present invention ensures absence of aliasing with consequent higher reliability of the lithography system. Since any one small portion in the scanned field may receive an exposure from multiple pulses, these periodic complex components may overlap and not average out. This will compromise the quality of the exposure and the image.

Figure 8:
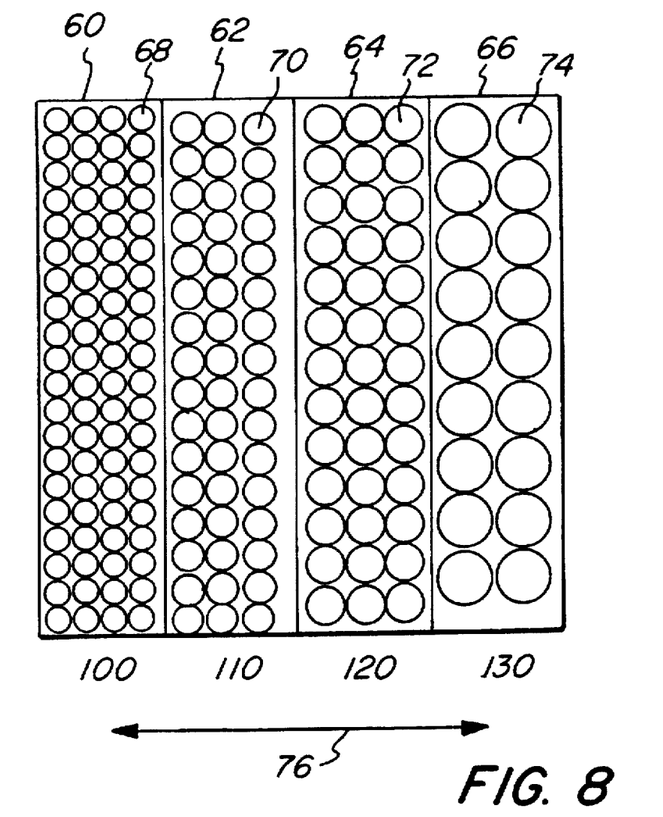
FIG. 8 schematically illustrates a multiplex array with a spatially frequency modulated pattern.
Figure 9:
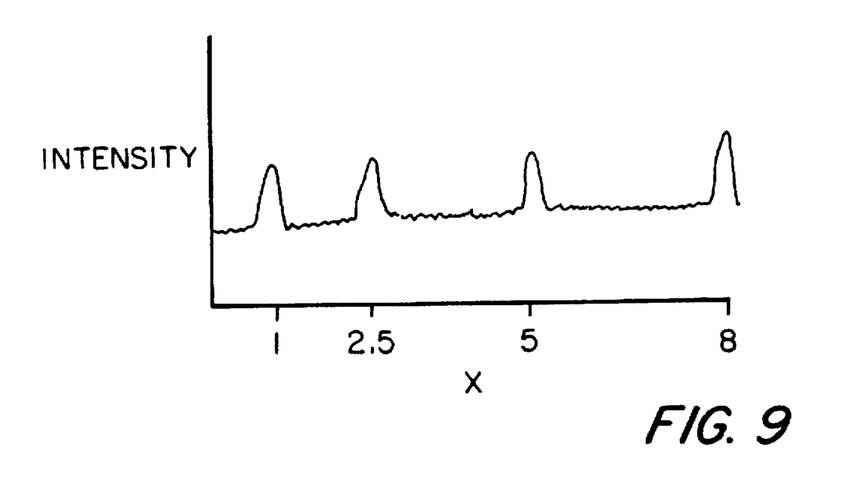
FIG. 9 is a graph illustrating a pattern with unequal distances.
Figure 10:
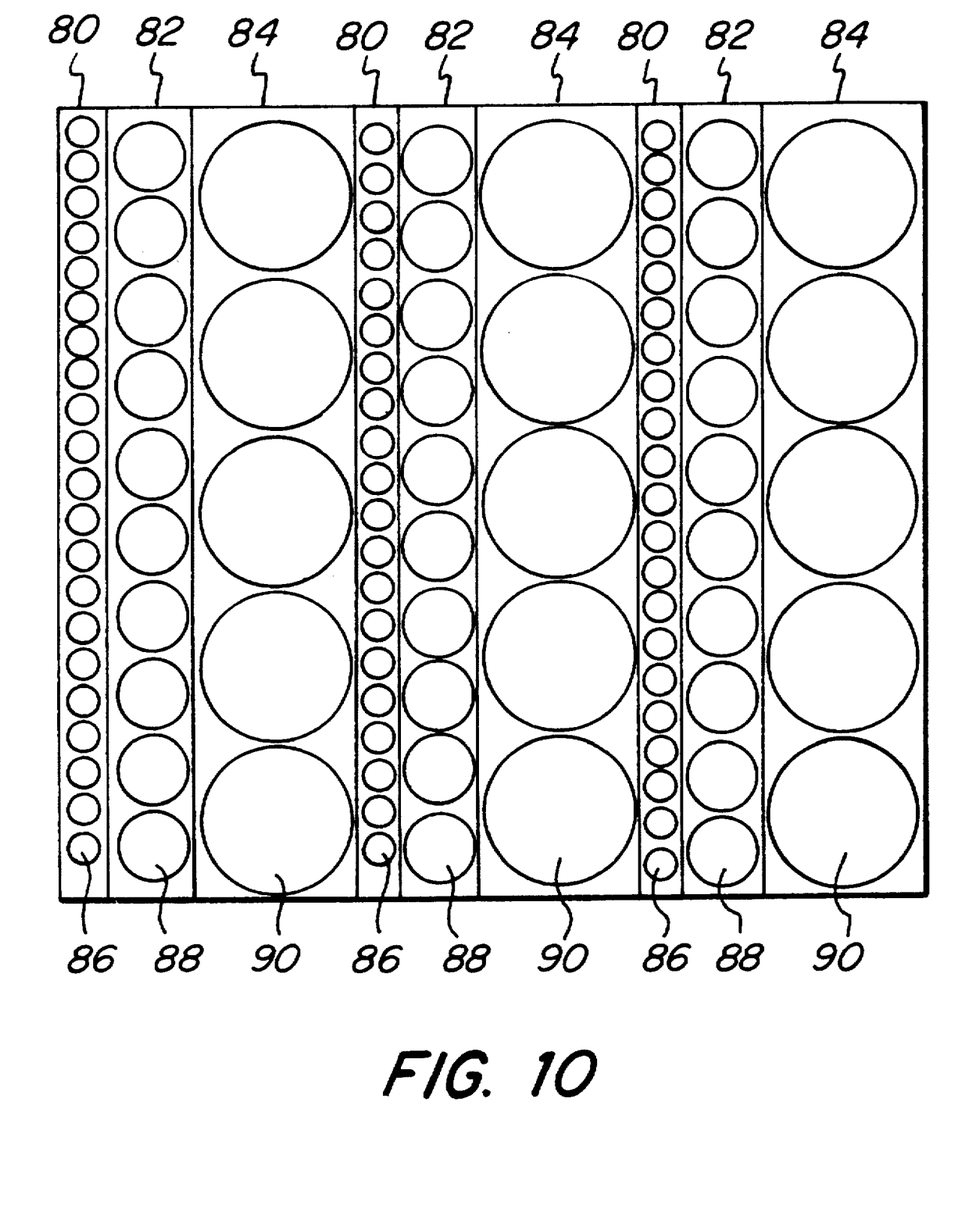
FIG. 10 schematically illustrates a multiplex array with another form of spatially frequency modulated pattern.

FIG. 8 schematically illustrates a multiplex array that has a spatially frequency modulated pattern that may be used at the locations of multiplex arrays 14 and/or 18 illustrated in FIG. 1 and 2. However, it should be appreciated that when the multiplex array illustrated in FIG. 8 is used at the locations of multiplex arrays 14 and/or 18, the modulator 36 illustrated in FIG. 1 and the frequency modulator illustrated in FIG. 2 would usually not be needed. The regular patterns or components 46 illustrated in FIG. 6 are generally the result of the periodic structure of a multiplexing array. By providing a spatially frequency modulated pattern of elements on the multiplexing array, of the present invention, any resulting pattern has a linear magnification dependent on position. That is, the distances in the scan direction between wave forms of the resulting pattern will not be equal. FIG. 9 graphically represents the unequal distances between adjacent wave forms in the resulting pattern. When this pattern is mutiplicatively printed in the scanning process the patterns may be made so that aliasing will not occur. As illustrated in FIG. 8, the multiplex array has elements in four different sections, 60, 62, 64, and 66. Each section 60, 62, 64, and 66 is comprised of elements different than the adjacent sections. For example, section 60 may be comprised of elements having a dimension of 100 units, section 62 may be comprised of elements having a dimension of 110 units, section 64 may be comprised of elements having a dimension of 120 units, and section 66 may be comprised of elements having a dimension of 130 units. The units are provided only to indicate relative size and may be any typical unit dimension for a multiplex array. Accordingly, the multiplex array has a spatially frequency modulated pattern. This spatially frequency modulated pattern need only be modulated in the direction of scan. Arrow 76 represents the direction of scan. Additionally, the spatially frequency modulated pattern illustrated in FIG. 8 as sections 60, 62, 64, and 66 are intended only to schematically represent a multiplex array. The elements 68, 70, 72, and 74 are schematically illustrated as different circle sizes, but may be any shape or pattern commonly used for an element in a multiplex array. The elements 68, 70, 72, and 74 extend along the entire longitudinal length of each respective section 60, 62, 64, and 66. Additionally, while only four sections 60, 62, 64, and 66 are illustrated in FIG. 8, there may be any number of sections. The sections may also repeat, that is a group of sections may be repeated forming multiple cycles in a single multiplex array. FIG. 10 illustrates this form of spatially frequency modulating the multiplex array. In FIG. 10 the multiplex array is formed from repeating longitudinal sections 80, 82, and 90. Each of the sections 80, 82, and 90 comprises an element 86, 88, and 90, respectfully, having a different dimension. Longitudinal sections 80, 82, and 90 form one cycle of the pattern which is repeated in the direction of scan. Therefore, three cycles are illustrated. The scanning direction is preferably substantially perpendicular to the longitudinal dimension of the sections 80, 82, and 90.

Accordingly, the present invention helps to eliminate pattern noise effects in illumination systems using multiplex arrays or multi-image arrays. As a result the present invention provides better illumination for use in a scanning lithography system increasing linewidth control, edge roughness, and other imaging properties.

Additionally, although the present invention has been illustrated with reference to a particular illumination system it should be appreciated that the present invention may be applied to other illuminations systems with a multiplex array or multi-image array. Therefore, it will be obvious to those skilled in the arts that various modifications may be made without departing from the spirit and scope of this invention.

What is claimed is:

1. An illumination system for use in scanning lithography comprising:

an illumination source, said illumination source providing electromagnetic radiation;

an optical system receiving the electromagnetic radiation from said illumination source, said optical system forming an illumination slot for projecting an image of a reticle onto a photosensitive resist covered wafer, the illumination slot scanning the reticle in a scan direction; and a multiplex array formed as a part of said optical system, said multiplex array having a spatially frequency modulated pattern of elements that varies in the scan direction providing a magnification dependent upon position, whereby aliasing due to periodic complex components is prevented and pattern noise produced by said multiplex array is reduced.

2. An illumination system for use in scanning lithography as in claim 1 wherein:

said illumination source is a pulsed source.

3. An illumination system for use in scanning lithography as in claim 1 wherein:

said illumination source is coherent.

4. An illumination system for use in scanning lithography as in claim 1 wherein:

a complex component resulting from said multiplex array is multiplicatively printed during scanning so that aliasing will not occur.

5. An illumination system for use in scanning lithography as in claim 1 wherein:

the magnification is linear.

6. An illumination system for use in scanning lithography comprising:

an illumination source, said illumination source providing electromagnetic radiation;

an optical system receiving the electromagnetic radiation from said illumination source, said optical system forming an illumination slot for projecting an image of a reticle onto a photosensitive resist covered wafer, the illumination slot scanning the reticle;

a multiplex array formed as a art of said optical system; and a frequency modulator coupled to said illumination source, said frequency modulator having a frequency modulation range and a frequency modulation rate so that at least one cycle of the frequency modulation range is performed during a single scan of a reticle, whereby pattern noise produced by said multiplex array is reduced.

7. An illumination system for use in scanning lithography comprising:

a pulsed illumination source, said pulsed illumination source providing electromagnetic radiation and having a pulse rate;

an optical system receiving the electromagnetic radiation from said pulsed illumination source, said optical system forming an illumination slot for projecting an image of a reticle onto a photosensitive resist covered wafer, the illumination slot scanning the reticle in a scan direction; and a multiplex array formed as a part of said optical system, said multiplex array having a spatially frequency modulated periodic pattern of elements varying in the scan direction thereon and providing a linear magnification dependent upon position;

whereby pattern noise is reduced.

8. An illumination system for use in scanning lithography as in claim 7 wherein:

said multiplex array is formed from a plurality of sections, each adjacent section of said plurality of sections formed from an element having a different dimension.

9. An illumination system for use in scanning lithography as in claim 8 wherein:

each of said plurality of sections extends longitudinally along a length of said multiplex array.

10. An illumination system for use in scanning lithography as in claim 9 wherein:

the length of said multiplex array is perpendicular to the scan direction.

11. An illumination system for use in scanning lithography as in claim 10 wherein:

said plurality of sections repeat forming multiple cycles.

12. An illumination system for use in scanning lithography comprising:

a pulsed illumination source, said pulsed illumination source providing electromagnetic radiation and having a pulse rate;

an optical system receiving the electromagnetic radiation from said pulsed illumination source, said optical system forming an illumination slot for projecting an image of a reticle onto a photosensitive resist covered wafer, the illumination slot scanning the reticle in a scan direction; and a multiplex array formed as a part of said optical system, said multiplex array having a spatially frequency modulated pattern in the scan direction thereon, wherein said multiplex array is formed from a plurality of sections, each adjacent section of said plurality of sections formed from an element having a different dimension and each of said plurality of sections extends longitudinally along a length of said multiplex array and the length of said multiplex array is perpendicular to the scan direction, the different dimension increases from one end to another end of said multiplex array, whereby pattern noise is reduced.

13. An illumination system for use in scanning lithography as in claim 12 wherein:

at least thirty pulses are used to expose a given portion of the wafer.

14. An illumination system for use in scanning lithography comprising:

a pulsed illumination source, said pulsed illumination source providing electromagnetic radiation and having a pulse rate;

an optical system receiving the electromagnetic radiation from said pulsed illumination source, said optical system forming an illumination slot for projecting an image of a reticle onto a photosensitive resist covered wafer, the illumination slot scanning the reticle in a scan direction;

a multiplex array formed as a part of said optical system; and a modulator coupled to said illumination source, said modulator frequency modulating the pulse rate of said pulsed illumination source, whereby pattern noise produced by said multiplex array is reduced.

15. An illumination system for use in scanning lithography as in claim 14 wherein:

said modulator has a frequency modulation range and a frequency modulation rate so that at least one cycle of the frequency modulation range is performed during a single scan of a reticle.

16. A scanning lithographic system comprising:

a pulsed laser illumination source having a pulse rate;

a frequency modulator coupled to said pulsed laser illumination source, said frequency modulator frequency modulating the pulse rate of the pulsed laser illumination source;

a beam conditioner positioned to receive electromagnetic radiation from said pulsed laser illumination source;

a multiplex array positioned to receive the electromagnetic radiation from said beam conditioner;

a condenser positioned to receive electromagnetic radiation form said multiplex array;

an illumination plane following said condenser, a rectangular illumination slot formed at said illumination plane;

a relay conjugating said rectangular illumination slot to a reticle, the rectangular illumination slot illuminating a portion of the reticle;

projection optics, said projection optics imaging the reticle onto a photosensitive resist covered wafer;

a reticle stage coupled to said reticle;

a wafer stage coupled to said wafer;

a stage control coupled to said reticle stage and said wafer stage, said stage control controlling the movement of reticle stage and said wafer stage so that the reticle and the wafer are synchronously scanned exposing a portion of the wafer with the image of the reticle.

17. An illumination system for use in scanning lithography as in claim 16 wherein:

said modulator has a frequency modulation range and a frequency modulation rate so that at least one cycle of the frequency modulation range is performed during a single scan of a reticle.

18. An illumination system for use in scanning lithography as in claim 17 wherein:

at least thirty pulses are used to expose a given portion of the wafer.

* * * * *